(12) United States Patent
Moon (10) Patent No.: US 6,441,623 B1
(45) Date of Patent: Aug. 27, 2002

(54) CAPACITIVE PROXIMITY SENSOR FOR AUTOMOTIVE USE

(75) Inventor: Antony Moon, Cardiff (GB)

(73) Assignee: AB Automotive Electronics Ltd. (GB)

( * ) Notice: Subject to any disclaimer, the term of this patent is extended or adjusted under 35 U.S.C. 154(b) by 0 days.

(21) Appl. No.: 09/499,221

(22) Filed: Feb. 7, 2000

(30) Foreign Application Priority Data

Jul. 29, 1999 (GB) .............................................. 9917817
Oct. 22, 1999 (GB) .............................................. 9925124

(51) Int. Cl.⁷ .............................................. G01R 27/26
(52) U.S. Cl. ........................ 324/661; 324/662; 324/686
(58) Field of Search .............................. 324/661, 662, 324/663, 671, 674, 681, 686, 687, 688, 690

(56) References Cited

U.S. PATENT DOCUMENTS

| | | | |
|---|---|---|---|
| 4,887,066 A | 12/1989 | Marek | 340/436 |
| 5,363,051 A | 11/1994 | Jenstrom et al. | 324/661 |
| 5,373,245 A | * 12/1994 | Vranish | 324/662 |
| 5,394,292 A | 2/1995 | Hayashida | 361/179 |
| 5,539,292 A | * 7/1996 | Vranish | 324/686 X |
| 5,872,507 A | 2/1999 | Weber et al. | 340/435 |
| RE36,772 E | * 7/2000 | Vranish et al. | 324/687 X |

FOREIGN PATENT DOCUMENTS

| | | | |
|---|---|---|---|
| EP | 0518836 A1 | 12/1992 | B25J/19/06 |
| GB | 2255641 A | 11/1992 | B60R/19/48 |
| GB | 2266397 | 10/1993 | |
| JP | 11235961 | 8/1999 | |
| WO | WO 86/02506 | 4/1986 | H03K/17/945 |
| WO | WO 89/08352 | 9/1989 | H03K/17/955 |
| WO | WO 97/01835 | 1/1997 | G08C/21/00 |

* cited by examiner

Primary Examiner—N. Le
Assistant Examiner—Wasseem H. Hamdan
(74) Attorney, Agent, or Firm—Ostrolenk, Faber, Gerb & Soffen, LLP (57) ABSTRACT

The present invention provides a capacitive sensor for fitting to the bumper of a vehicle to assist the driver when maneuvering the vehicle. The sensor comprises a guard plate and a sensor plate which are mounted on a vehicle bumper in use. The capacitance between the sensor plate and ground is measured to provide an indication of the proximity of any obstruction near the vehicle.

25 Claims, 5 Drawing Sheets

CAPACITIVE PROXIMITY SENSOR FOR AUTOMOTIVE USE

The present invention relates to a capacitive sensor in particular for attachment to a vehicle for sensing the proximity of the vehicle to other objects, for example to assist when maneuvering such a vehicle.

In recent years a number of luxury cars have been fitted with sensors particularly on the rear of the vehicle to warn the driver of objects so that when the vehicle is being reversed, a collision with unseen or obscured objects can be avoided whilst still being able to position the vehicle close to such objects, e.g. walls, bollards etc.

However, such sensors are complicated and expensive and consequently tend not to be commercially viable for lower cost cars.

SUMMARY OF THE INVENTION

Therefore, according to the present invention there is provided a proximity sensor for a vehicle comprising: an innermost guard plate; an outermost sensor plate; and calculation means for determining the capacitance between the sensor plate and ground for providing proximity information.

In a preferred embodiment, the plates are mounted on a vehicle bumper. This allows the plates to be mounted in close proximity to provide a strong output signal. In order to avoid being damaged, both plates are preferably mounted on the inside of the bumper whilst being separated by an insulator. The guard plate is used to shield the sensor plate to ensure that it only detects changes in the outwards direction, i.e. away from the vehicle. The plates preferably extend substantially along the entire length of the bumper including any portion passing around the corner of the vehicle. The sensor and guard plates are preferably provided as elongate strips extending along the length of the bumper. Furthermore, the guard plate is preferably wider than the sensing plate, ideally three to four times wider.

Because of the varying shape of the profile of the rear of the vehicle, the guard and/or sensor plate are preferably non-uniform in shape. In particular, the sensor plate preferably increases in width towards the ends. This provides increased and changing sensitivity toward and at the edges of the vehicle. With a uniform strip the sensitivity may be reduced at the edges because the obstruction can only couple capacitively with one side of the sensor, whereas an object directly behind the middle of the vehicle will couple capacitively with both sides of the sensor. Whilst the shape of the sensor plate is ideally tailored to the shape of the vehicle for each application, the sensing plate may have a simpler generic shape to provide improved sensitivity on all vehicles. For example, the sensing plate may comprise a central portion having uniform width with two end portions or stubs of larger width on each end. Alternatively, the sensing plate may have a central portion of uniform width with two end portions having progressively increasing widths.

The sensors of the present invention are primarily intended to be mounted on the rear of a vehicle to assist a driver when reversing. However, the sensors are also suitable for front or even side mounting, e.g. for avoiding collisions with objects at low-level which are obscured from view below the bonnet. When a vehicle is manoeuvring, either forwards or backwards, there is a danger that the side wings may strike an object if the vehicle is turning at the same time. A front or side mounted sensor could be provided to detect such objects near the wings particularly in front of the front wheels.

Different materials have different effects on the output of a capacitive sensor. For example people, concrete, wood, metal, stone and plants provide a strong output from the sensor whereas other objects can give weaker responses, in particular low mass insulating objects such as plastics. This may be problematic in view of the likelihood of encountering plastic objects such as cones when manoeuvring a vehicle. However, whilst objects of different materials provide different outputs, the relationship between the output from the sensor and the distance between the sensor and an object follows a similar formula (the sensor output increases as a power of the distance between the sensor and the object) for any object. By monitoring the speed of the vehicle it is possible to calculate the rate of change of the output from the sensor with distance from that object. Thus it is possible to obtain an indication of the range to the object which has been detected that is independent of the magnitude of the output signal from the sensor and thus use this to provide a more accurate indication of the distance between the object and the sensor irrespective of the material of the object being detected.

Therefore, in accordance with another aspect of the present invention there is provided a proximity sensor including means for determining the speed of the vehicle and wherein the calculation means is adapted to utilize this speed information along with the rate of change of the output to provide more accurate proximity information.

Although the sensor is sensitive to the presence of the surface along which the vehicle is travelling, because this normally has a constant effect, its effect on the determination of the distance to other objects can be cancelled out. However, where the vehicle is travelling over uneven ground then clearly the variation in the height of the sensor above the ground will give the appearance to the sensor that the ground is moving away or towards it. Furthermore, because most vehicles are supported on a 'springy' suspension, as the vehicle accelerates and decelerates, the vehicle tilts forward and backwards causing the front and rear of the vehicle to rise or fall relative to the ground. Again this can have the effect of appearing to the sensor that the ground is moving away from or towards the sensor. This tilting of the vehicle can lead to the sensor providing incorrect or varying information about the distance to an object. A similar effect can occur when the vehicle travels over objects such as metal drains or manhole covers that have good conductance to ground. Whilst these effects can be minimized by reducing the sensitivity of the sensor, clearly this means that the effective range at which an object can be detected is reduced.

Therefore, according to a further aspect of the present invention, the proximity sensor is provided with a second sensor for providing information about the ground clearance. This information can be used to correct the output from the main sensor allowing the sensitivity of the sensor to be maintained.

Whilst the second sensor is preferably a capacitive sensor arranged in a downward facing configuration, this is not essential and any manner of sensor which is capable of providing information about the height of the main sensor above the ground is adequate. Capacitive sensors are particularly preferable for detecting the presence of objects such as manhole covers which are substantially flush with the ground but, like a change in height, are likely to effect the main capacitive sensor.

In addition to the above, where the vehicle is moving towards a slope, the main sensor may be affected by the approaching slope but the ride height sensor, which is not yet over the incline of the slope, has not yet detected the change in height. It is therefore preferable to orient the second sensor such that instead of facing directly downwards, it is arranged to point or detect the height, slightly outwards of the vehicle to provide an indication of change in the slope of the ground over which the vehicle is travelling sooner so as to correspond more closely with the detection range of the main sensor.

BRIEF DESCRIPTION OF THE DRAWINGS

There will now be described a specific embodiment of the present invention with reference to the accompanying drawings in which.

DETAILED DESCRIPTION OF THE INVENTION

Figure 3A:
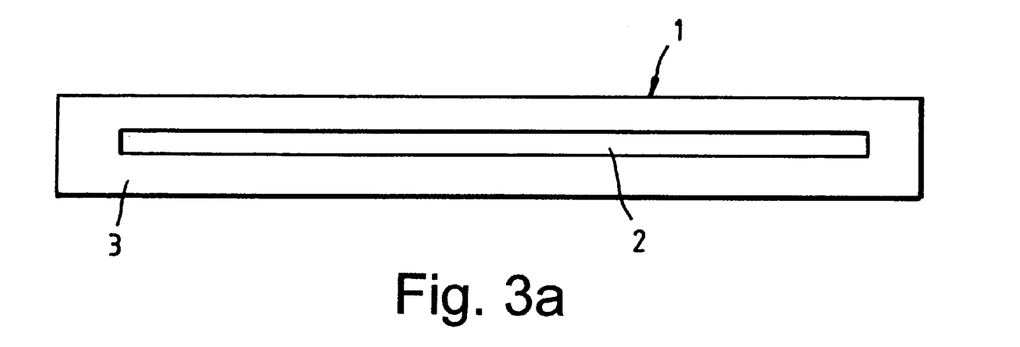
FIG. 3a shows a sensor having uniform width sensor plates respectively.
Figure 3B:
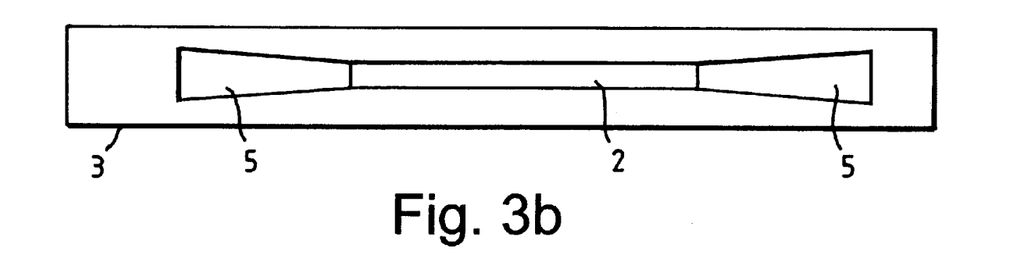
FIGS. 3b, 3c, 3d, 3e and 3f show examples of sensors having non-uniform sensor plates.
Figure 3C:
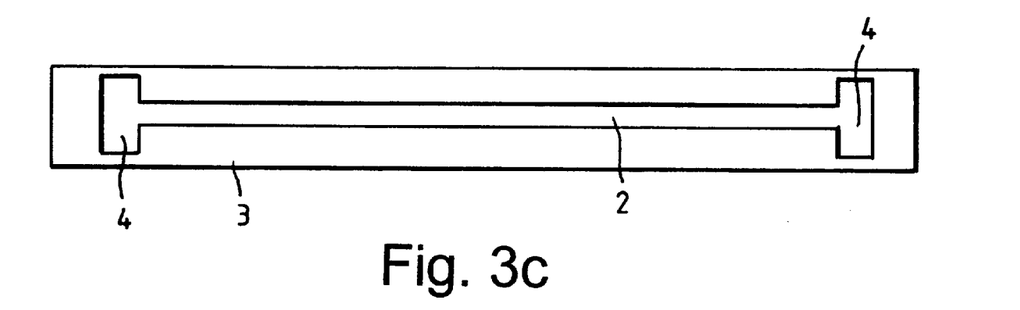

A sensor 1 consists of two strips of metal, or other conductive material, insulated from each other and provided on the inside of the bumper 6 of a vehicle 10. The two strips of metal form the guard plate 3 and the sensor plate 2 of the sensor. The plate which is on the outermost part of the vehicle is called the sensor plate and the plate on the innermost side, closest to the vehicle itself, is the called the guard plate. FIGS. 3a, 3b and 3c show examples of the arrangement of the guard and sensor plates relative to each other. Although the sensor plates are shown as being flat in FIGS. 3a, 3b and 3c, in use the laminated sensors would be fitted to the profile of the inside of the bumper 6 (which may not be flat) of the vehicle to which they were attached.

The sensor plate 2 would be typically around 25 mm wide whilst the guard plate 3 is typically three to four times the width of the sensor plate, as shown in FIG. 3a. Where the sensor plate has a non-uniform width, the relative widths of the guard and sensor plate vary along their lengths with the sensor plate being relatively wider at the ends than in the middle.

In use, the guard and sensor plates are connected to a control unit (not shown). The control unit supplies high frequency signals to the sensing and guard plates. Objects in the vicinity to the vehicle present a capacitance to ground. In fact this capacitance is formed by two capacitances in series, namely a capacitance between the sensor plate and the object in series with a capacitance between the object and ground. The control unit measures this capacitance between the sensor plate and ground. The unit may be triggered automatically when reverse gear is engaged (for a rear mounted system), manually or otherwise. When the unit is triggered, it measures the initial capacitance between the sensor plate and ground. As the vehicle is moved towards such an object, the capacitance increases. The measured capacitance provides an indication of the distance between any objects in close proximity to the vehicle and the sensor plate, and hence the rear of the vehicle. The control unit senses the change in capacitance and uses this to provide the driver with an indication of the distance to the object. This indication can be provided in any number of ways. For example the control unit can be arranged to provide different tones depending on the range to a target. A broken tone could be output when the object is for example 80 cm away, then as the target moves closer, at about 50 cm the tone could become faster, and finally at a close range of about 30 cm the tone could change to a continuous tone to signal the driver to stop reversing.

Figure 1:
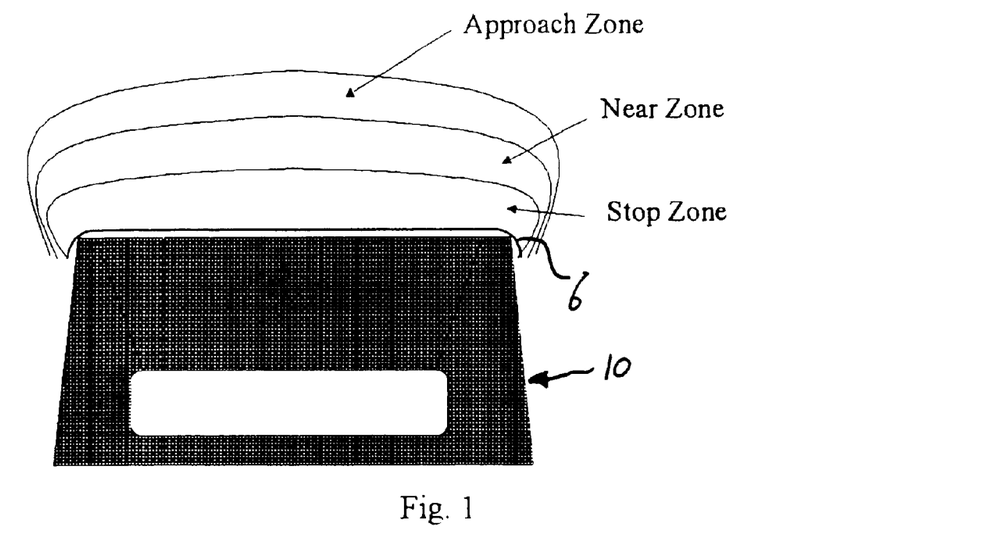
FIG. 1 shows the range of sensitivity of a sensor having uniform guard and sensor plates.

FIG. 1 shows an example of the relative ranges of three zones of sensitivity: an approach zone; a near zone and a stop zone. In FIG. 1, the sensing plate and guard plate have uniform widths as shown in FIG. 3a. It will be apparent from FIG. 1 that as the vehicle moves towards an object, the respective position of the object across the width of the vehicle would affect the distance from the vehicle at which it is sensed. For example, if the vehicle is reversing towards a bollard which is located along the center line of the vehicle then the bollard will be detected earlier than if the bollard was located at the extreme left or right of the vehicle. This is applicable in all three of the detection zones.

Figure 2:
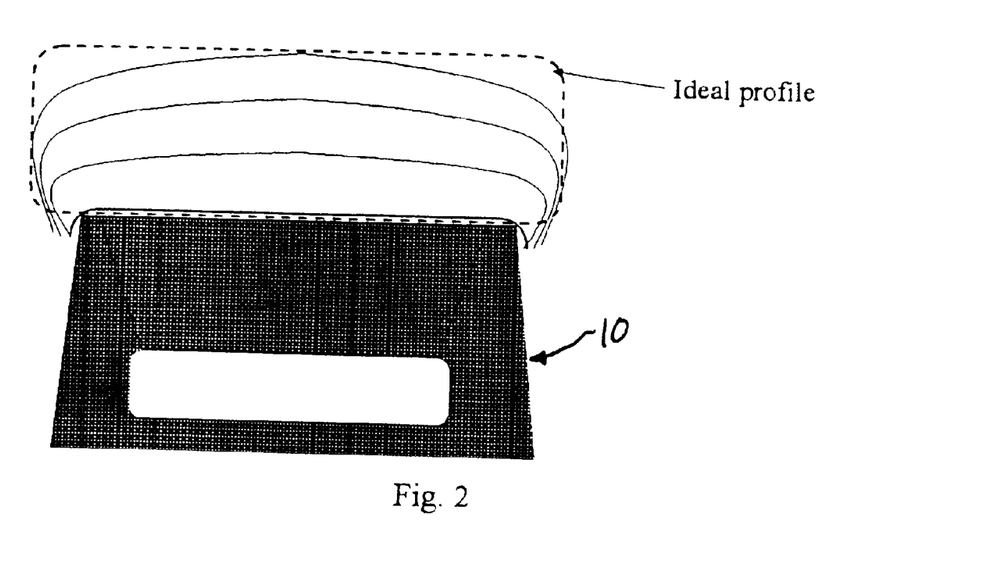
FIG. 2 shows the range of an ideal sensor profile.

FIG. 2 shows an ideal profile for the sensing areas. A sensor having this profile would detect objects at given distances regardless of their relative position across the width of the car. The sensor of the present invention aims to achieve such an ideal profile by increasing the sensitivity at the ends of the sensor and/or reducing the sensitivity in the center of the sensor. This is achieved in the present invention by varying the shape of the sensor plate. Rather than using a sensor plate with uniform width, a sensor plate which is wider at the ends than in the middle is used.

In order to approximate the sensor profile as closely as possible to the ideal profile shown in FIG. 2, the width of the sensor plate should be varied to correspond to the shape and orientation of the vehicle bumper. However, this would require separate sensors to be made for every different shape of vehicle and vehicle bumper. However, considerable improvements in the sensor profile can be made by providing a sensor plate which has a central portion having a substantially uniform width along the central part of the bumper with the ends of the sensor plate having an increased width to provide improved sensitivity at the ends of the bumper corresponding to the edge of the vehicle.

Figure 3D:
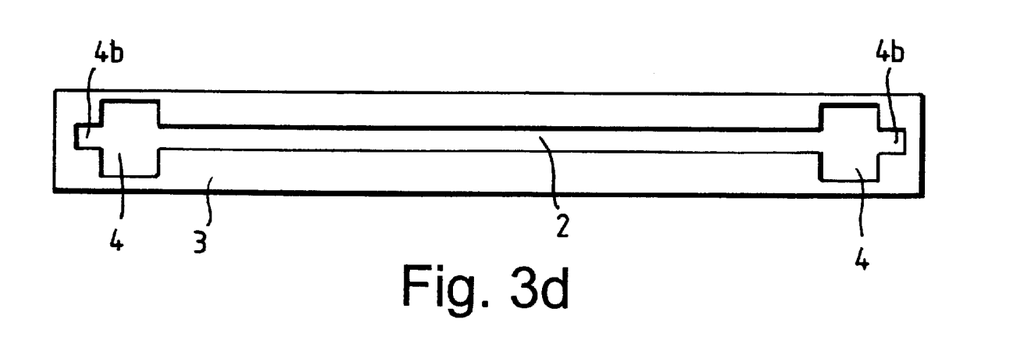
Figure 3E:
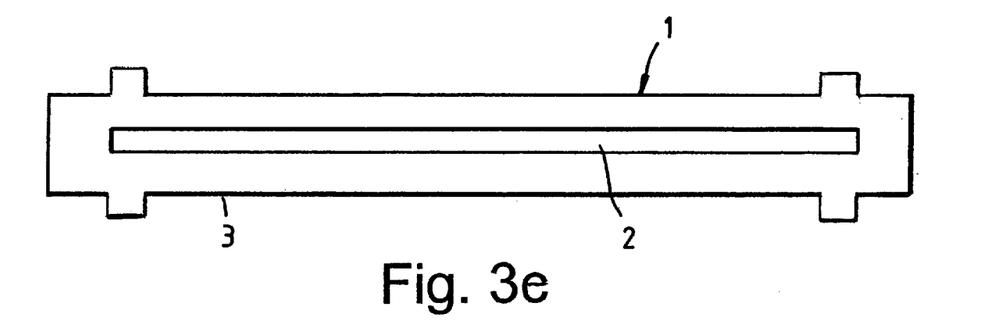
Figure 3F:
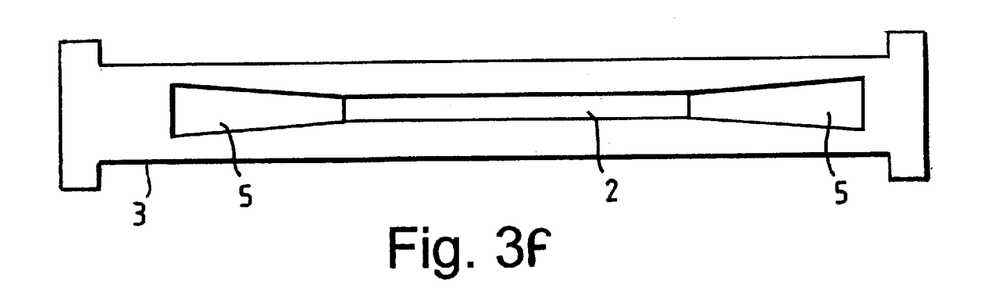

The sensor plate may have a profile as shown in FIG. 3b having sections 5 where the width is progressively increased towards the end of the bumper or alternatively, the sensor plate may have a central portion of uniform width and two end portions of larger widths as shown in FIG. 3c. Here small sections 4, or stubs, of increased width added to the ends of the sensor plate. FIG. 3d shows a modified version of the sensor plate shown in FIG. 3c. This arrangement has a stub of increased width located slightly in from the ends of the sensor plate, leaving a narrow section 4b at the end of the sensor plate. This shape provides the improved sensitivity around the corner of the vehicle, an even response to obstructions behind/in front of the vehicle whilst rejecting obstructions to either side of the car which would not get in the way when the vehicle is moving forwards or backwards. For example, when a car is reversing into a space between two other cars such as in a car park, it is inconvenient for the sensor to trigger because of the parked cars on either side. Thus the arrangement shown in FIG. 3d provides improved sensitivity at the corners of the vehicle without providing unnecessary sensitivity to objects at the side of the vehicle which will not obstruct the passage of the vehicle.

The sensor and guard plates are provided on the inner surface of the outer edge of the bumper so that the plates are protected from being damaged but are still as close to the rear of the vehicle as possible. However, the plates may be formed in the bumper itself or in the packing material of the bumper.

A capacitive sensor according to the present invention can detect any object that possesses sufficient mass, especially objects which are even slightly conducting. Thus objects such as concrete, wood, metal, stone and organic materials such people, animals, plants or trees are detected without difficulty. However objects which have low mass and which are insulating such as plastic materials like cones provide a poor response.

Figure 4:
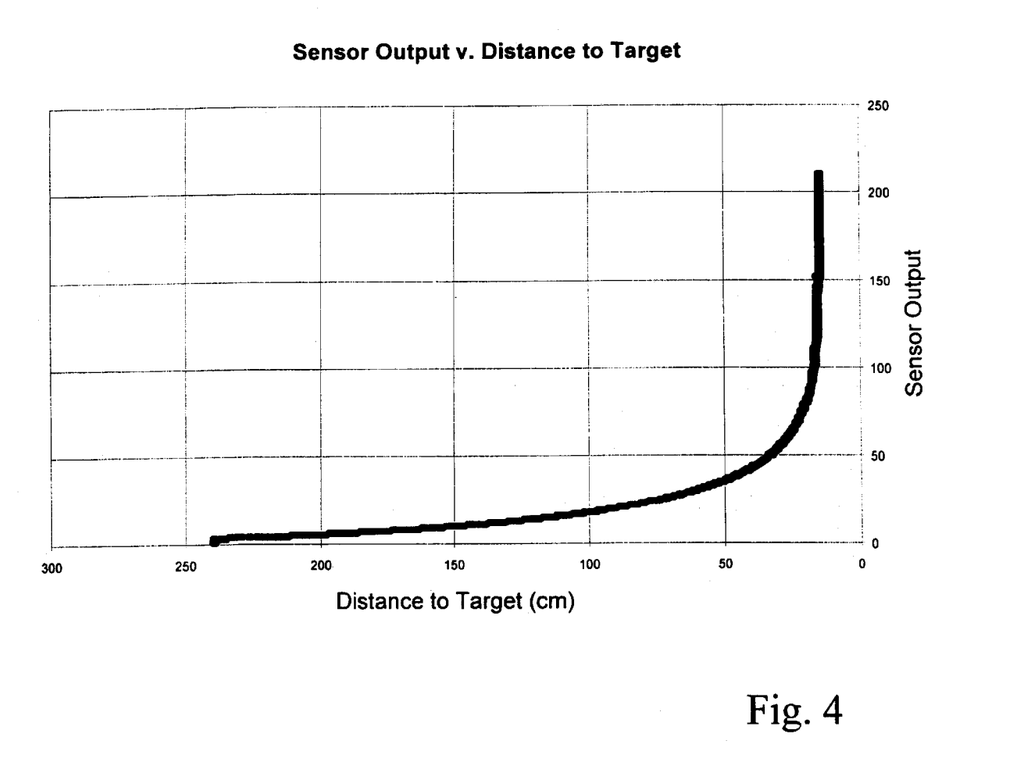
FIG. 4 shows a graph of sensor output against distance to a target.

FIG. 4 shows a graph providing an indication of the sort of output which is provided by the sensor for an object which is a given distance away. FIG. 4 in particular represents the response where a 2.5 cm diameter metal pole is moved towards the sensor. It is apparent from FIG. 4 that the response provided by the sensor is exponential. Whilst the sensitivity and amplitude of the output varies from object to object, the underlying shape of the response curve is substantially the same for all objects.

In a practical implementation, as the voltage output from the sensor increases above pre-set thresholds, the driver of the vehicle is provided with different types of warnings, for example at ranges of 80, 50 and 30 cm. However, low mass or insulating objects give a much lower output from the sensor and the warning that would normally be triggered at 80 cm for most other conducting objects may not be given until the object is as little as 40 cm away. Clearly this provides a very narrow margin from which the sensor moves from indicating the maximum range to the minimum range which is correspondingly reduced. Furthermore, this provides an inconsistent indication of the range to an object. It is inconvenient if the driver becomes accustomed to the first warning being provided at a range of 80 cm to suddenly be faced with the warning only coming on at 40 cm which may result in the driver not bringing the vehicle to a halt quickly enough.

The general shape of the response curve from the sensor is known and by monitoring the change in the output from the sensor as the vehicle moves towards an object, it is possible to determine from the rate of change of the sensor output and the speed of the vehicle where on the curve the sensor output lies and whether the object is of a material which would provide a strong output or one which would provide a weak output. This may be done simply by monitoring the output from the sensor and examining the magnitude of the output and the rate of change of the output and if the output, although weak, is rising rapidly with distance, the sensor can determine that the object is much closer to the vehicle than a "typical" object. The sensor can then trigger the alert appropriate to the range of the object from the vehicle. This may be simply to provide the mid-range warning instead of the far range warning or to actively recalibrate the sensor output responsive to the properties of the detected object to provide an accurate output of the distance to the object.

Where a vehicle is travelling over rough ground the height of the sensor above the ground will vary. Similarly whilst the vehicle is manoeuvring the change in speed caused by braking or accelerating has a tendency to cause the vehicle to tilt forward or backwards due to the vehicle being mounted on a sprung suspension. Consequently, particularly if the braking or acceleration is hard, the ends of the vehicle will move up or down appreciably, again causing the height of the sensor above the ground to vary. Whilst the presence of the surface over which the vehicle is travelling has an effect on the sensor, as long as the height of the sensor above the surface remains constant this will have a constant effect and thus the effect of the surface can be ignored. However, when the height of the sensor above the ground varies due to acceleration/deceleration of the vehicle, then the effect of the ground on the sensor will vary significantly. This can cause the sensor to believe that there is an object closer to, or further away from, the vehicle than in fact there is and this can trigger a false warning. Whilst this can be overcome by reducing the sensitivity of the sensor, this clearly reduces the effective range on which the sensor can be usefully used. In order to overcome this problem, a second sensor 20 is fitted to the vehicle to provide an indication of the height of the main sensor above the ground and to compensate for any changes in height.

This second sensor 20 may be capacitive sensor similar to the main sensor 1. In this way, the second sensor 20 gives an output that is related to the ground clearance by subtracting its output from the output of the main, outward facing sensor. The effect of changes in ground clearance are thus eliminated. In this way sensitivity of the main sensor 1 can be maintained allowing objects to be detected at a longer range.

Whilst it is convenient to provide the second sensor 20 as a capacitive sensor, effectively acting as a reference, it is also possible to utilise any other kind of height indicating sensor which can be appropriately calibrated to provide an output to compensate for changes in the height of the vehicle detected by the main sensor. For example, a vehicle which is already fitted with a ride-height sensor can be modified to provide an output from that height sensor to the sensor of the present invention.

Whilst the above modification provides compensation for changes in the height of the ground over which the vehicle is travelling directly below the sensor, in practice the vehicle may be manoeuvring over flat ground towards a sloping surface or uneven ground, e.g. a curb. Under these circumstances, the main outward facing sensor would detect the change in height before the height sensor and consequently would be misled into believing there was an object close to it and may trigger a false alarm.

Figure 5:
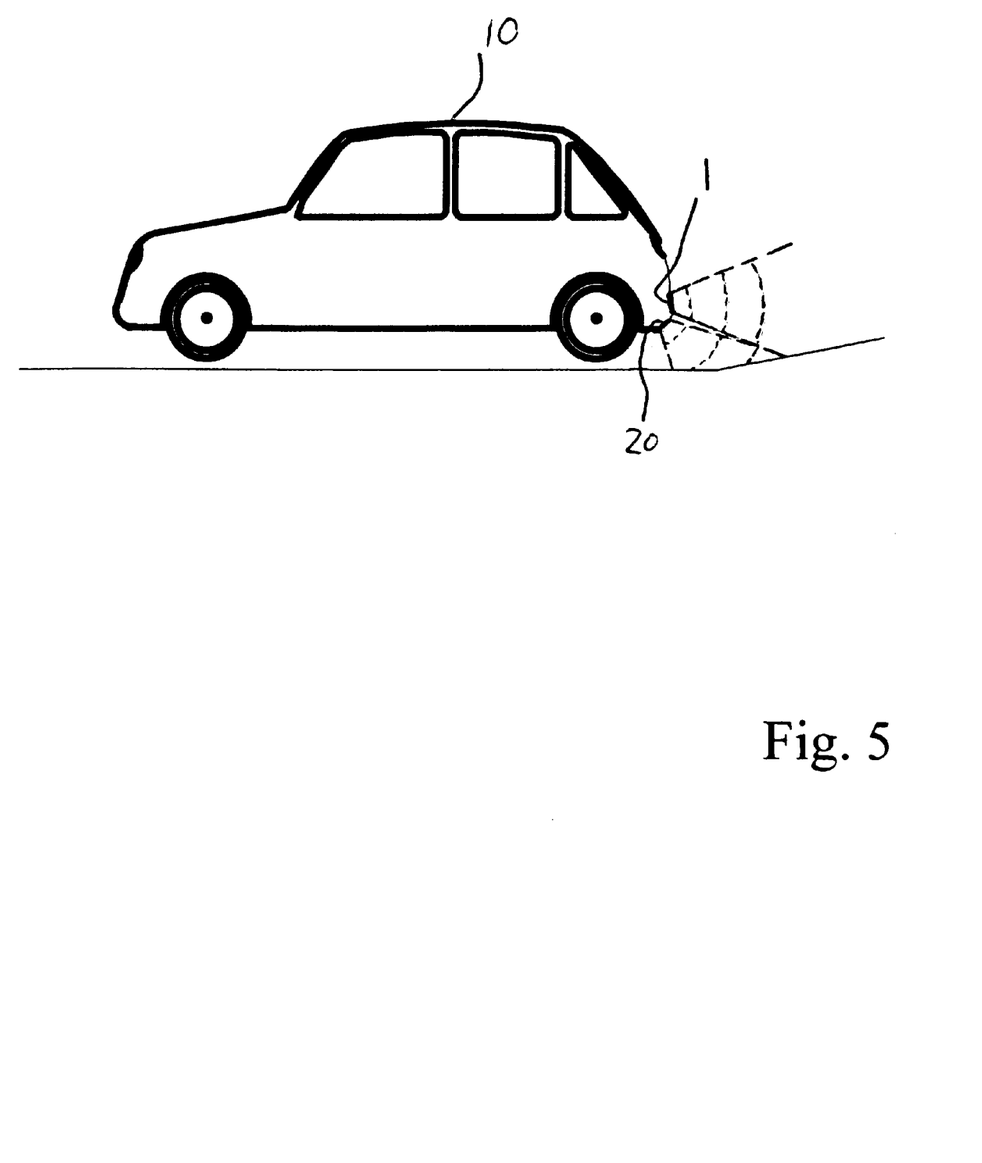
FIG. 5 shows a schematic view of a vehicle fitted with a secondary sensor.

Consequently in a further modification of the present invention the secondary sensor is arranged to point slightly outwards of the vehicle as well as down. This can be seen in FIG. 5 where the secondary sensor 20 detects the height of the ground outwards of the vehicle rather than underneath the very back of the vehicle. In this way, the secondary sensor 20 can provide a more accurate indication of the height of the main sensor 1 relative to the ground which the main sensor is detecting. This in turn provides a more accurate correction for the variation in the height of the ground over which the sensor is detecting.

The Invention claimed is:

1. A proximity sensor for a vehicle comprising:
   a guard plate;
   an elongate sensor plate having a length dimension; and
   a calculation device which deter a change in capacitance between the sensor plate and an object that is capacitively connected to electrical ground for providing proximity information based on the change in capacitance, said proximity information representing a distance between the sensor plate and the object, wherein the sensor plate lacks a uniform width along its length, and wherein the sensor plate has a portion at each end having a larger width than a portion in the middle thereof.

2. A proximity sensor according to claim 1 wherein the guard plate and sensor plate are arranged close to each other.

3. A proximity sensor according to claim 1 wherein the sensor plate is an elongate strip.

4. A proximity sensor according to claim 3 wherein the width of the sensor plate at a given point along the length of the sensor plate corresponds to the shape and orientation of a bumper to which the sensor is to be attached.

5. A sensor according to claim 3 wherein the sensor plate has a central part having substantially uniform width, and end sections having at least a portion having a larger width.

6. A sensor according to claim 5 wherein the width of the end sections of the sensor plate progressively increase towards the ends.

7. A sensor according to claim 5 wherein the width of the end sections is uniform.

8. A sensor according to claim 5 wherein the end sections comprise a first part having a width larger than the central part and a second outermost part having a width less than the first part.

9. A sensor according to claim 1 wherein the guard plate is an elongate strip.

10. A sensor according to claim 9 wherein the guard plate has a width which is larger at the ends.

11. A sensor according to claim 1 wherein a width of the guard plate at a given point corresponds to the shape and orientation of the bumper to which it is to be attached.

12. A sensor according to claim 1 wherein the calculation means determines the proximity information based upon the speed of the vehicle, the determined capacitance and the rate of change of the determined capacitance.

13. A sensor according to claim 1 further comprising a height sensor that measures the height of the proximity sensor above a surface and provides a compensating signal based on the measured height, wherein the calculation device uses the compensating signal to make corrections to the proximity information.

14. A sensor according to claim 13 wherein the height sensor is a capacitive sensor.

15. A sensor according to one of claims 13 and 14 wherein the height sensor is arranged to detect the height of the proximity sensor above the ground outward of the vehicle.

16. A vehicle having a proximity sensor attached thereto; said proximity sensor comprising:

a guard plate;

an elongate sensor plate having a length dimension; and a calculation device which determines a change in capacitance between the sensor plate and an object that is capacitively connected to electrical ground for providing proximity information based on the change in capacitance, said proximity information representing a distance between the sensor plate and the object, wherein the sensor plate lacks a uniform width along its length, and wherein the sensor plate has a portion at each end having a larger width than a portion in the middle thereof.

17. A vehicle bumper having a proximity sensor attached thereto; said proximity sensor comprising:

a guard plate;

an elongate sensor plate having a length dimension; and a calculation device which determines a change in capacitance between the sensor plate and an object that is capacitively connected to electrical ground for providing proximity information based on the change in capacitance, said proximity information representing a distance between the sensor plate and the object, wherein the sensor plate lacks a uniform width along its length, and wherein the sensor plate has a portion at each end having a larger width than a portion in the middle thereof.

18. A vehicle bumper according to claim 17 wherein the guard plate and the sensor plate are mounted on an inner surface of the bumper.

19. A vehicle bumper according to claim 18 wherein the guard plate and the sensor plate extend substantially along the full length of the bumper.

20. A vehicle bumper according to claim 19, further comprising a height sensor that measures the height of the proximity sensor above a surface and provides a compensating signal based on the measured height, wherein the calculation device uses the compensating signal to make corrections to the proximity sensor, said height sensor being mounted on the bumper.

21. A vehicle bumper according to claim 18, further comprising a height sensor that measures the height of the proximity sensor above a surface and provides a compensating signal based on the measured height, wherein the calculation device uses the compensating signal to make corrections to the proximity information, said height sensor being mounted on the bumper.

22. A vehicle bumper according to claim 17 wherein the guard plate and the sensor plate extend substantially along the full length of the bumper.

23. A vehicle bumper according to claim 22, further comprising a height sensor that measures the height of the proximity sensor above a surface and provides a compensating signal based on the measured height, wherein the calculation device uses the compensating signal to make corrections to the proximity information, said height sensor being mounted on the bumper.

24. A vehicle bumper according to claim 17, further comprising a height sensor that measures the height of the proximity sensor above a surface and provides a compensating signal based on the measured height, wherein the calculation device uses the compensating signal to make corrections to the proximity information.

25. A vehicle having a vehicle bumper attached thereto; said vehicle bumper having a proximity sensor attached thereto; said proximity sensor comprising:

a guard plate;

an elongate sensor plate having a length dimension; and a calculation device which determines a change in capacitance between the sensor plate and an object that is capacitively connected to electrical ground for providing proximity information based on the change in the capacitance, said proximity information representing a distance between the sensor plate and the object, wherein the sensor plate lacks a uniform width along its length, and wherein the sensor plate has a portion at each end having a larger width than a portion in the middle thereof.

* * * * *

UNITED STATES PATENT AND TRADEMARK OFFICE
CERTIFICATE OF CORRECTION

PATENT NO.     : 6,441,623 B1
DATED          : August 27, 2002
INVENTOR(S)    : Anthony Moon It is certified that error appears in the above-identified patent and that said Letters Patent is hereby corrected as shown below:

<u>Title page,</u>
Item [75], Inventor, should read -- Anthony Moon, Cardiff (GB) --

Signed and Sealed this

Eighteenth Day of March, 2003

JAMES E. ROGAN
*Director of the United States Patent and Trademark Office*